United States Patent
Yang et al.

(10) Patent No.: US 7,315,484 B2
(45) Date of Patent: Jan. 1, 2008

(54) MEMORY CONTROLLER CAPABLE OF ESTIMATING MEMORY POWER CONSUMPTION

(75) Inventors: Ying-Chih Yang, Hsinchu (TW); Jen-Yi Liao, Hsinchu (TW); Yuan-Ning Chen, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 358 days.

(21) Appl. No.: 11/028,543

(22) Filed: Jan. 5, 2005

(65) Prior Publication Data

US 2005/0152212 A1    Jul. 14, 2005

(30) Foreign Application Priority Data

Jan. 14, 2004    (TW) .............................. 93100881A

(51) Int. Cl.
*G11C 8/00*    (2006.01)
(52) U.S. Cl. ................. 365/233; 713/300; 713/340
(58) Field of Classification Search ........ 713/300–340; 365/223, 233
See application file for complete search history.

(56) References Cited

U.S. PATENT DOCUMENTS 6,615,326 B1 *    9/2003    Lin ............................ 711/154

2005/0125703 A1 *    6/2005    Lefurgy et al. ............. 713/320

* cited by examiner

*Primary Examiner*—Thomas Lee
*Assistant Examiner*—Brian J Bochicco
(74) *Attorney, Agent, or Firm*—Bacon & Thomas, PLLC

(57) ABSTRACT

A memory controller capable of estimating memory power consumption includes a memory control unit, a command dispatch device, plural bank state machines and a power-state and current-accumulation device. The memory control unit generates control signals based on a memory access command sent by a system for accessing a synchronous dynamic random access memory (SDRAM). The command dispatch device synchronously receives the control signals sent by the controller to the SDRAM. The plural bank state machines are connected to the command dispatch device to receive the control signals dispatched by the command dispatch device and accordingly determine whether to transfer its internal state or not. The power-state and current-accumulation device determines on which state the SDRAM is in accordance with states of the plural band state machines, thereby computing current consumption of the SDRAM.

6 Claims, 4 Drawing Sheets

MEMORY CONTROLLER CAPABLE OF ESTIMATING MEMORY POWER CONSUMPTION

BACKGROUND OF THE INVENTION

1. Field of the Invention

The present invention relates to the memory controller and, more particularly, to a memory controller capable of estimating memory power consumption.

2. Description of Related Art

Currently, with rapidly developing semiconductor process, embedded system design has entered into an era of System-on-Chip (SOC) which integrates a CPU module, specific IPs and peripherals into a single chip as an application specific system. FIG. 1 is a block diagram of an MPEG II SOC decoding system. As shown, to increase operation speed, an on-chip memory module 120 is typically added into the SOC system and also data cache and instruction cache are added into the MIPS (millions of instructions per second) module 110 (not shown). However, the on-chip memory module 120, data cache and instruction cache are limited by process so as to have only 8 Kbyte, 16 Kbyte or 32 Kbyte typically.

Obviously, the aforementioned on-chip memory module 120 cannot meet with required memory for such a typical SOC system. In addition, due to limited die size, large amount of memory cannot be implemented in the SOC system. Thus, to meet with required memory, in addition to the MPEG II SOC decoding system, a synchronous DRAM 180 is added to allow the MIPS module 110 to store temporary data. However, power consumption cannot be estimated because the synchronous DRAM 180 is implemented outside the SOC system. One approach to estimate the power consumption applies average power recorded in datasheet for the synchronous DRAM 180 to power consumption estimation, but it is unable to perform a precise estimation. Therefore, it is desirable to provide an improved power estimation to mitigate and/or obviate the aforementioned problems.

SUMMARY OF THE INVENTION

The object of the present invention is to provide a memory controller capable of estimating memory power consumption, which can accurately estimate memory power consumption, thereby avoiding the cited problem in the prior.

To achieve the object, a memory controller capable of estimating memory power consumption is provided. The memory controller includes a memory control unit, a command dispatch device, plural bank state machines and a power-state and current-accumulation device. The memory control unit generates control signals in accordance with a memory access command sent by a system for accessing a synchronous dynamic random access memory (SDRAM). The command dispatch device synchronously receives the control signal sent by the controller to the SDRAM. The plural bank state machines are connected to the command dispatch device in order to receive the control signal dispatched by the command dispatch device and accordingly determine whether to transfer its internal state or not. The power-state and current-accumulation device determines on which state the SDRAM is in accordance with states of the plural band state machines, thereby computing current consumption of the SDRAM.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
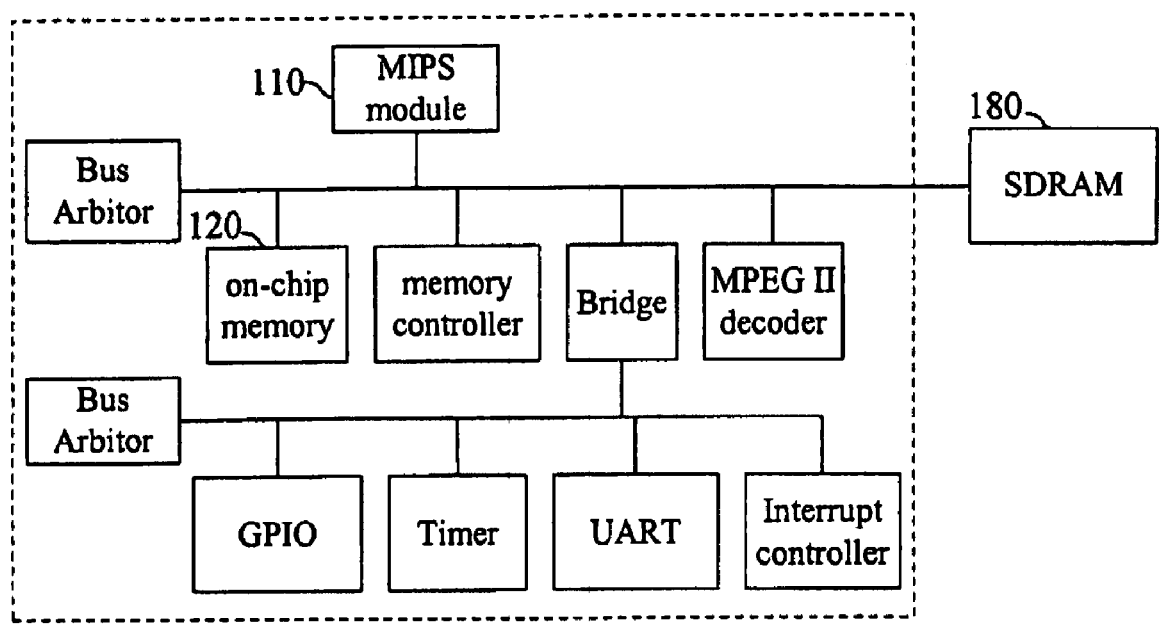
FIG. 1 is a block diagram of a typical MPEG II SOC decoding system.
Figure 2:
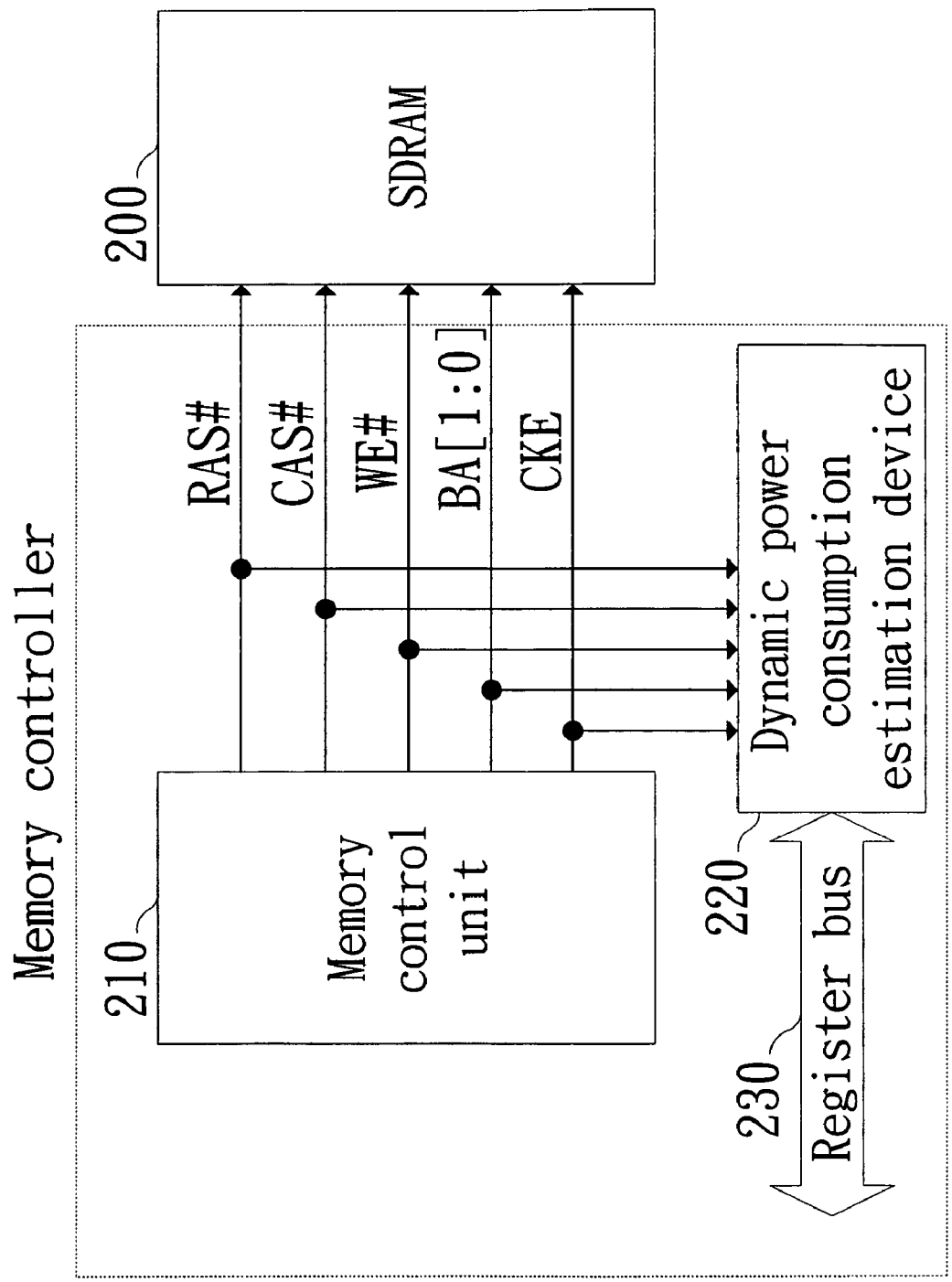
FIG. 2 is an embodied diagram of a memory controller capable of estimating memory power consumption in accordance with the invention.

FIG. 2 is an embodied diagram of a memory controller capable of estimating memory power consumption in accordance with the invention. In FIG. 2, the memory controller includes a memory control unit 210, a dynamic power consumption estimation device 220, and a register bus 230. The memory controller is connected to a synchronous dynamic random access memory (SDRAM) 200. The SDRAM 200 can be a double data rate synchronous DRAM (DDR-SDRAM). As shown in FIG. 2, the memory control unit 210 is a typical controller for a synchronous DRAM, which generates control signals to access the SDRAM 200 in this case. The dynamic power consumption estimation device 220 is connected to the memory control unit 210 for generating triggering events of internal state machines by monitoring the control signal sent by the memory control unit 210.

Figure 3:
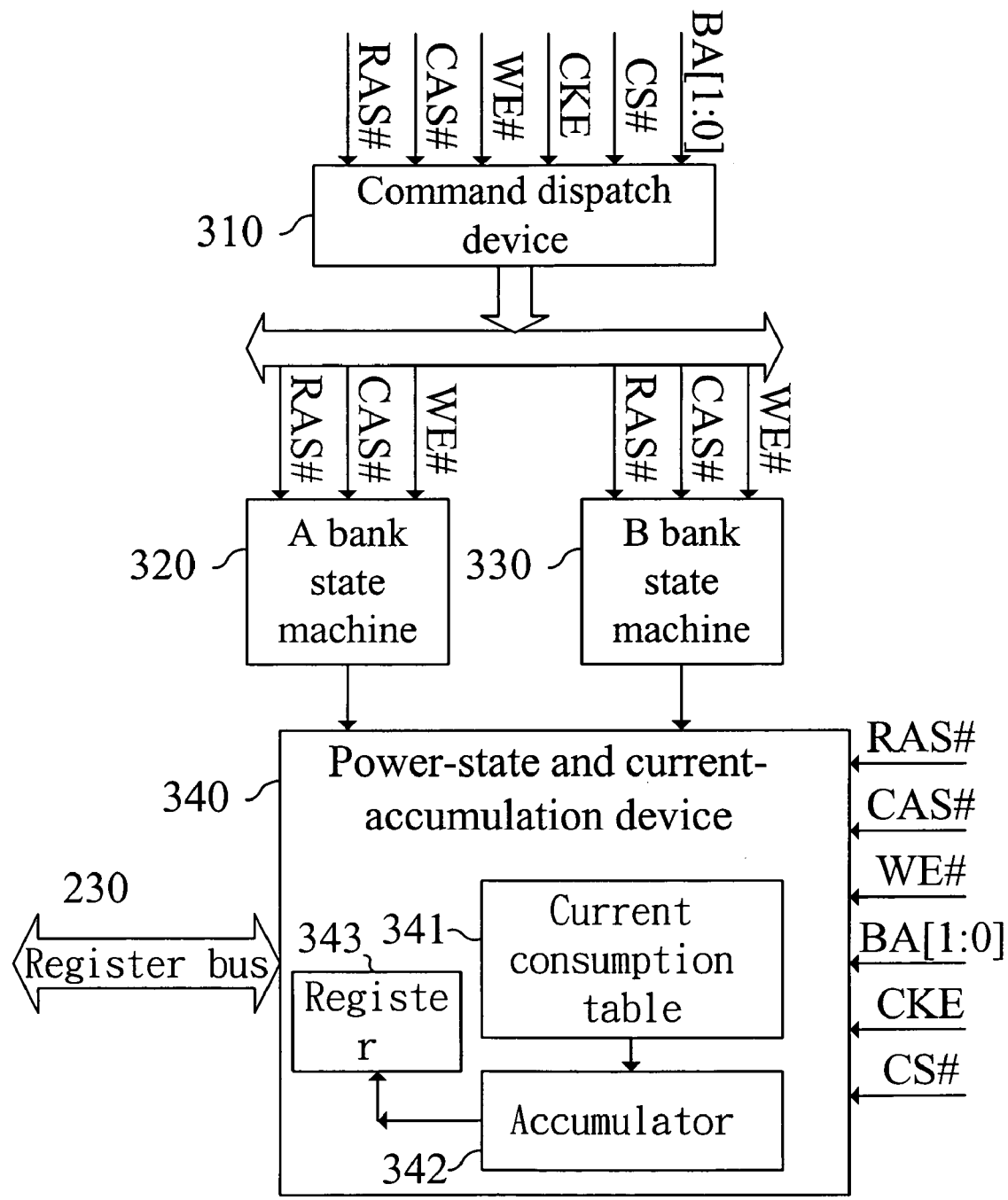
FIG. 3 a block diagram of an internal circuit of dynamic power consumption estimation device of FIG. 2 in accordance with the invention.

FIG. 3 is a block diagram of an internal circuit of dynamic power consumption estimative device 220 of FIG. 2 in accordance with the invention. In FIG. 3, the device 220 includes a command dispatch device 310, an A-bank state machine 320, a B-bank state machine 330 and a power-state and current-accumulation device 340. The device 340 further includes a current consumption table 341, an accumulator 342 and a register 343. The command dispatch device 310 synchronously receives the control signals sent by the memory control unit 210 to the SDRAM 200 and dispatches the control signals received to a corresponding memory bank. Access command sent by the memory control unit 210 includes read/write command and data length for accessing the SDRAM 200. The command dispatch device 310 converts the access command into corresponding command (i.e., read/write and length) of memory bank.

Figure 4:
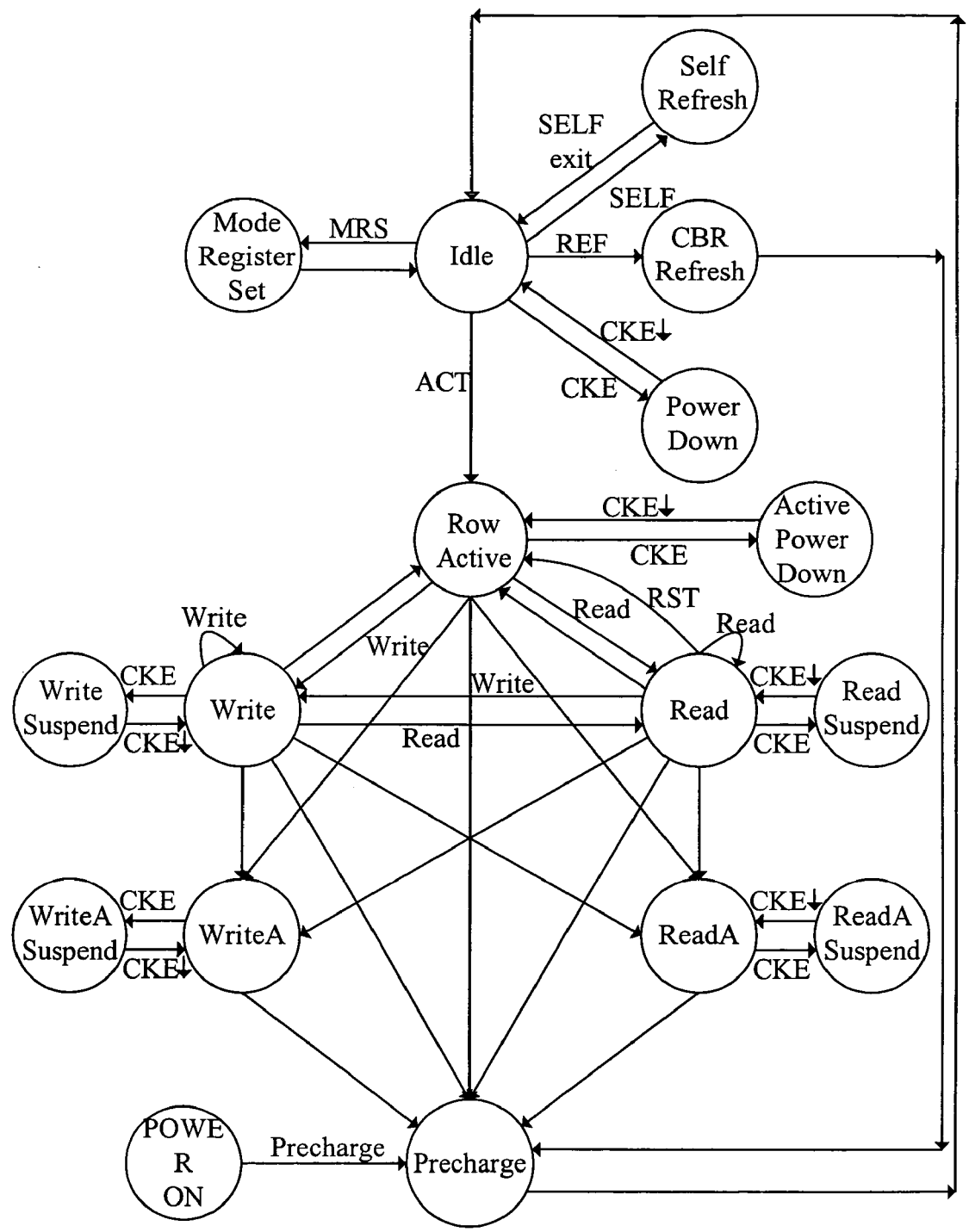
FIG. 4 is a state transition diagram of A-bank and B-bank state machines in accordance with the invention.

FIG. 4 is a state transition diagram of A-bank and B-bank state machines in accordance with the invention. As shown, A-bank and B-bank state machines 320 and 330 determine to transfer their states or not in accordance with the control signals. This state transition diagram of A-bank and B-bank state machines is identical to a state machine of the SDRAM 200. Namely, when A-bank state machine 320 and B-bank state machine 330 receive the control signals the same as the SDRAM 200, their states are the same. At this point, A-bank state machine 320 and B-bank state machine 330 output the states to the power-state and current-accumulation device 340 to determine on which state the SDRAM 200 is.

The power-state and current-accumulation device 340 finds a memory bank current consumed value based on the states of A-bank state machine 320 and B-bank state machine 330 and the current consumption table 341. The accumulator 342 accumulates the value found and resets accumulated current consumed value after storage. The accumulated current consumed value is stored in the register 343 periodically so that system firmware (not shown) can read the accumulated current consumed value (the nearest previous time). As such, memory power consumption can be obtained accurately.

In view of foregoing, it is known that the invention establishes the state machines in the controller for synchronously simulating behaviors of the SDRAM 200 and obtaining the state. Accordingly, power consumption of the SDRAM 200 can be estimated accurately, thereby avoiding the prior problem.

Although the present invention has been explained in relation to its preferred embodiment, it is to be understood that many other possible modifications and variations can be made without departing from the spirit and scope of the invention as hereinafter claimed.

What is claimed is:

1. A memory controller for estimating memory power consumption, comprising:
   a memory control unit, which generates control signals in accordance with a memory access command sent by a system for accessing memory;
   a command dispatch device, which synchronously receives the control signals sent by the controller to the memory;
   plural bank state machines, which are connected to the command dispatch device in order to receive a control signal dispatched by the command dispatch device and accordingly determine whether to transfer its internal state or not, wherein the plural bank state machines have a state transition diagram which is identical to that of the memory; and
   a power-state and current-accumulation device, which determines the state of the memory based on the states of the plural bank state machines, thereby computing current consumption of the memory.

2. The memory controller as claimed in claim 1, wherein the power-state and current-accumulation device has a current consumption table for lookup to compute current consumption of the memory and thus obtain a current consumed value.

3. The memory controller as claimed in claim 2, wherein the power-state and current-accumulation device has a register for storing the current consumed value.

4. The memory controller as claimed in claim 3, wherein the current consumed value is written in the register periodically.

5. The memory controller as claimed in claim 1, wherein the memory is a synchronous dynamic random access memory (SDRAM).

6. The memory controller as claimed in claim 1, wherein the memory is a double data rate SDRAM (DDR-SDRAM).

* * * * *